US012740440B2

(12) United States Patent
Shimazaki

(10) Patent No.: US 12,740,440 B2
(45) Date of Patent: Sep. 15, 2026

(54) SEMICONDUCTOR DEVICE AND SEMICONDUCTOR MODULE

(71) Applicant: LAPIS TECHNOLOGY CO., LTD., Kanagawa (JP)

(72) Inventor: Koya Shimazaki, Kanagawa (JP)

(73) Assignee: LAPIS TECHNOLOGY CO., LTD., Kanagawa (JP)

( * ) Notice: Subject to any disclaimer, the term of this patent is extended or adjusted under 35 U.S.C. 154(b) by 831 days.

(21) Appl. No.: 17/948,750

(22) Filed: Sep. 20, 2022

(65) Prior Publication Data

US 2023/0099673 A1 Mar. 30, 2023

(30) Foreign Application Priority Data

Sep. 24, 2021 (JP) ................................ 2021-156045

(51) Int. Cl.
*H10W 70/40* (2026.01)
*H10W 74/10* (2026.01)
*H10W 90/00* (2026.01)

(52) U.S. Cl.
CPC ........ *H10W 70/475* (2026.01); *H10W 70/411* (2026.01); *H10W 74/111* (2026.01); *H10W 90/759* (2026.01)

(58) Field of Classification Search
CPC ........... H01L 23/49589; H01L 23/3107; H01L 23/49503; H01L 24/48; H10W 70/475;
(Continued)

(56) References Cited

U.S. PATENT DOCUMENTS 4,608,592 A * 8/1986 Miyamoto ........ H01L 23/49827 257/E23.079
9,324,639 B2 * 4/2016 Magni ............... H01L 23/49503
(Continued)

FOREIGN PATENT DOCUMENTS

JP H03106759 U 11/1991
JP H08-162607 A 6/1996
(Continued)

OTHER PUBLICATIONS

Japanese Office Action dated May 27, 2025 in Japanese Patent Application No. 2021-156045.

*Primary Examiner* — Nathan W Ha
(74) *Attorney, Agent, or Firm* — VOLENTINE, WHITT & FRANCOS, PLLC

(57) ABSTRACT

A semiconductor device includes a semiconductor IC, a capacitor element, a support portion, a first conductor and second conductor, and a sealing body. The semiconductor IC has a first IC terminal and a second IC terminal. The capacitor element has a first terminal and a second terminal. The support portion supports the capacitor element and the semiconductor IC. The first conductor and second conductor extend so as to connect the first terminal and second terminal with, respectively, the first IC terminal and second IC terminal. The sealing body encloses the capacitor element, the semiconductor IC, the first conductor, the second conductor and the support portion. The first IC terminal and second IC terminal, the first terminal and second terminal, the first conductor and the second conductor are disposed at the inner side relative to an outer edge of the support portion.

15 Claims, 11 Drawing Sheets

(58) Field of Classification Search
CPC . H10W 70/411; H10W 74/111; H10W 90/759
See application file for complete search history.

(56) References Cited

U.S. PATENT DOCUMENTS 10,504,848 B1* 12/2019 Parto .................. H01L 23/5389
10,910,293 B1* 2/2021 Wang ................ H01L 23/49551
11,145,579 B1* 10/2021 Kinzer .............. H01L 23/49562
11,658,130 B2* 5/2023 Luo .................. H01L 23/49575 257/669
12,315,829 B2* 5/2025 Rice ........................ H01L 24/42
2001/0054760 A1* 12/2001 Ito ........................ H02M 3/157 257/E23.079
2005/0173783 A1* 8/2005 Chow ..................... H01L 24/27 257/E21.705
2005/0200007 A1 9/2005 Liu
2005/0263863 A1* 12/2005 Sasaki ............... H01L 23/49506 257/676
2006/0057793 A1* 3/2006 Hatori ................ H10D 84/0133 257/E29.054
2016/0005678 A1* 1/2016 Magni .................. H01L 23/481 257/676
2016/0344353 A1* 11/2016 Watts ..................... H05K 1/111
2017/0317015 A1* 11/2017 Lee ..................... H01L 23/3107
2018/0019194 A1* 1/2018 Papillon ............ H01L 23/49575
2018/0366397 A1* 12/2018 Yasunaga .......... H01L 23/49568
2019/0007027 A1* 1/2019 Tsutsumi ............... H03H 9/205
2019/0088577 A1* 3/2019 Shimoyama ...... H01L 23/49562
2019/0355679 A1* 11/2019 Wu .................. H01L 23/49811
2020/0066609 A1* 2/2020 Mohn .................. H01L 25/162
2021/0175860 A1* 6/2021 Roberts .................. H03F 3/245
2022/0068821 A1* 3/2022 Cheah ..................... H01L 25/50
2022/0077113 A1* 3/2022 Ong ....................... H10D 88/00
2022/0084995 A1* 3/2022 Hosokawa .............. H01L 25/18
2022/0285911 A1* 9/2022 Yamaguchi ............. H01L 24/32
2023/0109471 A1* 4/2023 Ishimatsu ......... H01L 23/49555 257/666
2023/0121777 A1* 4/2023 Ishimatsu ......... H01L 23/49575 257/666

FOREIGN PATENT DOCUMENTS

JP H10148642 A 6/1998
JP 2008235551 A 10/2008

* cited by examiner

REF1
33b
17
35
31
31a
13
19a
Ax1
15
33
33a
33b
23
33d
33c 33
33a
33b
19c
27c
31
27b
19b
25
29a
29b
31a
27a
19a
13
15c
15a
15b
152

FIG.5

41
11
43
43a
43b
44
43d
REF1
33b
35
17
31a
31
45
13
19a
Ax1
15
33
33a
33b
43c
33d
33c
44
43d

FIG.7

SEMICONDUCTOR DEVICE AND SEMICONDUCTOR MODULE

CROSS-REFERENCE TO RELATED APPLICATION

This application is based on and claims priority under 35 USC 119 from Japanese Patent Application No. 2021-156045 filed on Sep. 24, 2021, the disclosures of which are incorporated by reference herein.

BACKGROUND

Technical Field

The present disclosure relates to a semiconductor device and a semiconductor module, and particularly relates to a semiconductor device in which a semiconductor integrated circuit (IC) is sealed and to a semiconductor module in which the semiconductor device is mounted on a printed circuit board.

Related Art

Japanese Patent Application Laid-Open (JP-A) No. H8-162607 (Patent Reference 1) discloses disposing a capacitor in a vicinity of a semiconductor IC on a die pad. The semiconductor IC and the capacitor are molded in molding resin to form a semiconductor device.

For example, a semiconductor device is structured by a semiconductor IC with plural pad terminals, a capacitor element and plural conductors electronically connecting the semiconductor IC with the capacitor element via the pad terminals. In this structure, an electronic connection formed by one pad electrode of the semiconductor IC, one of the conductors, one terminal of the capacitor element, the dielectric of the capacitor element, another terminal of the capacitor element, another of the conductors, and another pad electrode of the semiconductor IC may operate as an antenna. The semiconductor device according to Patent Reference 1 has no disclosure regarding this antenna being caused by the one conductor electronically connecting between the one terminal of the capacitor element and the semiconductor IC and the another conductor electronically connecting between the another terminal of the capacitor element and the semiconductor IC.

When the one pad electrode and the another pad electrode of the semiconductor IC are connected to an internal circuit, the antenna described above forms an electrical loop. Electromagnetic noise is generated by this loop-shaped antenna, leading to failures in the semiconductor IC. For example, electromagnetic induction arises in accordance with changes in magnetic flux passing through the loop-shaped antenna, leading to failures in the semiconductor IC through the generation of induced currents.

SUMMARY

An object of the present disclosure is to provide a semiconductor device and semiconductor module that may reduce induction currents due to electromagnetic induction resulting from electronic connection of a capacitor element with a semiconductor IC and that may suppress failures of the semiconductor IC.

In order to solve the problem described above, a semiconductor device according to the present disclosure includes: a semiconductor IC including a first IC terminal and a second IC terminal; a capacitor element including a first terminal and a second terminal; a support portion including a support region with a principal surface that supports the capacitor element and the semiconductor IC; a first conductor and a second conductor that extend so as to connect the first terminal and second terminal of the capacitor element with, respectively, the first IC terminal and second IC terminal of the semiconductor IC; and a sealing body that encloses the capacitor element, the semiconductor IC, the first conductor, the second conductor and the support region. The first IC terminal and second IC terminal of the semiconductor IC, the first terminal and second terminal of the capacitor element, the first conductor and the second conductor are disposed at the inner side relative to an outer edge of the principal surface of the support region.

In order to solve the problem described above, a semiconductor module according to the present disclosure includes: the semiconductor device; and a printed circuit board with a principal surface that includes a mounting area on which the semiconductor device is mounted. The printed circuit board, the semiconductor IC and the support region are arranged in this order along a first axis direction that is orthogonal to the principal surface of the printed circuit board. The printed circuit board includes a conductive layer. The first IC terminal and second IC terminal of the semiconductor IC, the first terminal and second terminal of the capacitor element, the first conductor and the second conductor are provided between the conductive layer of the printed circuit board and the support region.

According to the present disclosure, a semiconductor device and semiconductor module may be provided that reduce induction currents due to electromagnetic induction resulting from electronic connection of a capacitor element with a semiconductor IC and that suppress failures of the semiconductor IC.

BRIEF DESCRIPTION OF DRAWINGS

FIG. 5 is a plan view showing a semiconductor module according to an exemplary embodiment of the present disclosure.

FIG. 7 is a sectional diagram showing the semiconductor module according to the exemplary embodiment of the present disclosure.

DETAILED DESCRIPTION

Figure 1:
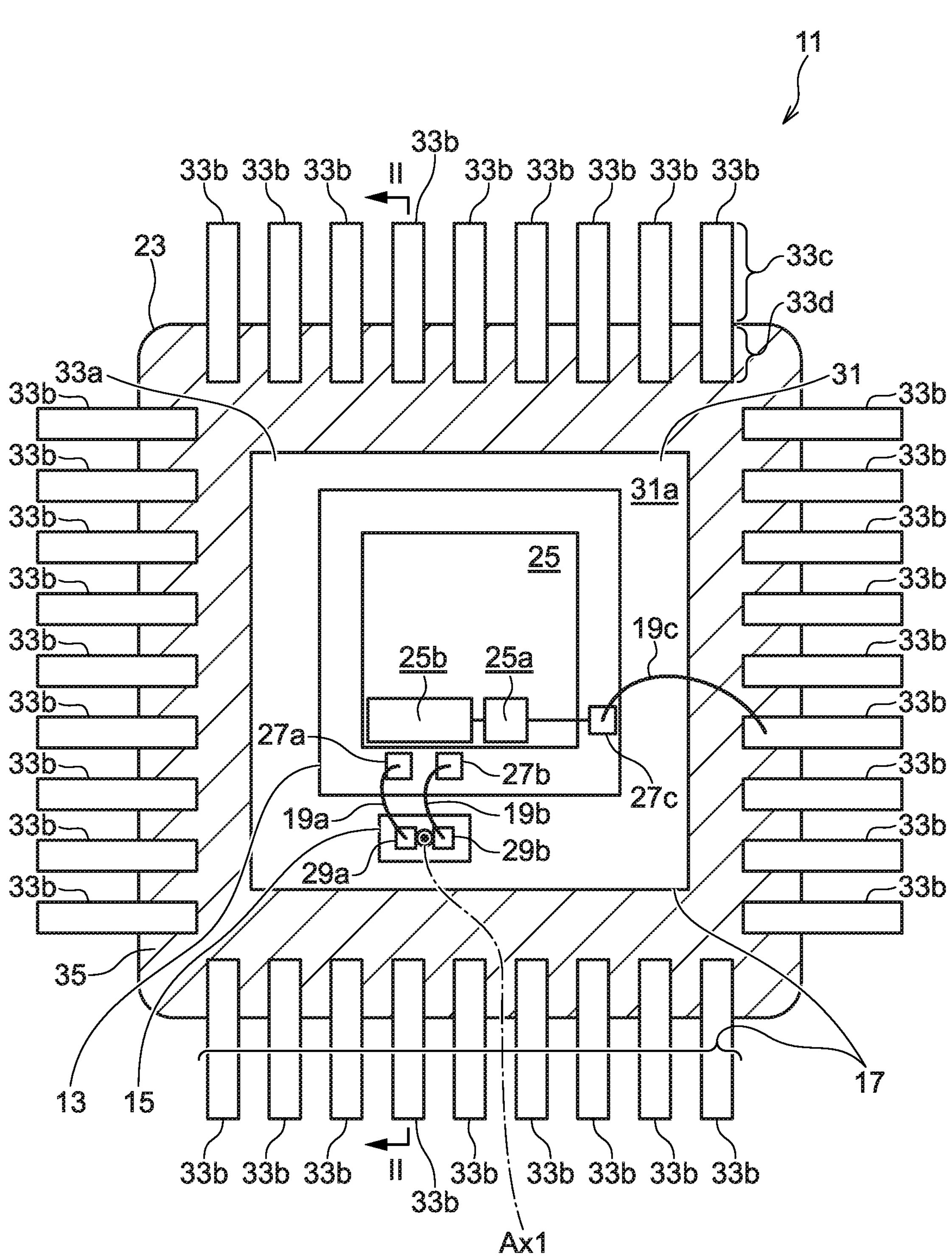
FIG. 1 is a plan view showing a semiconductor device according to an exemplary embodiment of the present disclosure.

Below, exemplary embodiments of the present disclosure are described in detail with reference to the attached drawings.

First Exemplary Embodiment

A semiconductor device according to the present exemplary embodiment is described with reference to FIG. 1 and FIG. 2. To avoid complexity in the drawings, hatching to indicate a section is not marked in FIG. 2.

FIG. 1 is a plan view of a semiconductor device 11 according to the present exemplary embodiment. The semiconductor device 11 includes a semiconductor IC 13, a capacitor element 15, a support portion 17, a first conductor 19*a*, a second conductor 19*b*, a sealing body 23 and a third conductor 19*c*.

The semiconductor IC 13 includes a semiconductor integrated circuit 25 in which numerous semiconductor components are integrated. The semiconductor IC 13 may be, for example, a silicon large-scale integration (LSI) integrated circuit. The semiconductor IC 13 includes plural IC terminals 27*a*, 27*b* and 27*c*. The plural IC terminals 27*a* and 27*b* are connected to the semiconductor integrated circuit 25 via conductors. The IC terminal 27*c* is connected to the support portion 17 via a conductor. Each of the plural IC terminals 27*a*, 27*b* and 27*c* may be illustrated as being a pad electrode. In this exemplary embodiment, as shown in FIG. 1, the semiconductor integrated circuit 25 of the semiconductor IC 13 may include an internal circuit 25*a* and another internal circuit 25*b* (for example, an embedded voltage regulator) that provides power to the internal circuit 25*a*. The embedded regulator has an output that is connected to the first IC terminal 27*a* of the semiconductor IC 13. The internal circuit 25*a* has an output that is connected to, for example, the third IC terminal 27*c*.

The capacitor element 15 includes a first terminal 29*a* and a second terminal 29*b*. The first terminal 29*a* is separated from the second terminal 29*b* by a dielectric of the capacitor element 15. A capacitance of the capacitor element 15 may be, for example, a number of microfarads, specifically from 0.1 to 4.7 μF. In the exemplary embodiment, as shown in FIG. 1, the capacitor element 15 is connected via the first conductor 19*a* to the output of the embedded regulator and to a reference voltage line (for example, a ground line).

The support portion 17 includes a support region 31. The support region 31 includes a principal surface 31*a* that supports the semiconductor IC 13 and the capacitor element 15. The semiconductor IC 13 and the capacitor element 15 are fixed to the principal surface 31*a* by adhesive. The support region 31 is a metal body. In plan view, the support region 31 may be formed in an arbitrary shape that is capable of supporting the semiconductor IC 13, capacitor element 15 and so forth such as, for example, a substantially square shape, a substantially rectangular shape or the like. A lead frame is an example of the support portion 17. Details of the support portion 17 are described below.

The first conductor 19*a* extends so as to electronically connect the first terminal 29*a* of the capacitor element 15 with the first IC terminal 27*a* of the semiconductor IC 13. The second conductor 19*b* extends so as to electronically connect the second terminal 29*b* of the capacitor element 15 with the second IC terminal 27*b* of the semiconductor IC 13. The third conductor 19*c* extends so as to electronically connect the support portion 17 with the third IC terminal 27*c* of the semiconductor IC 13. The first conductor 19*a* and the second conductor 19*b* are interconnects that electronically connect, respectively, the first IC terminal 27*a* and second IC terminal 27*b* of the semiconductor IC 13 with the first terminal 29*a* and second terminal 29*b* of the capacitor element 15. The third conductor 19*c* is an interconnect that electronically connects the third IC terminal 27*c* of the semiconductor IC 13 with the support portion 17.

The sealing body 23 encloses the semiconductor IC 13, the capacitor element 15, the first conductor 19*a*, the second conductor 19*b*, the third conductor 19*c* and the support region 31. Details of the sealing body 23 are described below.

According to this semiconductor device 11, the semiconductor IC 13 and the capacitor element 15 are supported by the principal surface 31*a* of the support region 31, and are disposed on the principal surface 31*a*. The first conductor 19*a* and second conductor 19*b* both connect from one to the other of the semiconductor IC 13 and capacitor element 15 so as to electronically connect the semiconductor IC 13 and the capacitor element 15 with one another.

According to these connections, an electronic connection including the first IC terminal 27*a* of the semiconductor IC 13, the first conductor 19*a*, the first terminal 29*a* of the capacitor element 15, the second terminal 29*b* of the capacitor element 15, the second conductor 19*b* and the second IC terminal 27*b* of the semiconductor IC 13 is electronically closed off by the semiconductor integrated circuit 25 of the semiconductor IC 13 to form an antenna in a loop shape. Below, this loop-shaped antenna is referred to as a loop antenna. The support region 31 blocks electromagnetic noise, meaning external magnetic flux in a direction from the support region 31 toward the capacitor element 15. As a result, for example, external magnetic flux amounts passing through the loop antenna may be reduced.

If the first conductor 19*a* and second conductor 19*b*, which are portions of the loop antenna, are disposed at the inner side relative to an outer edge of the principal surface 31*a* of the support region 31, effects of electromagnetic induction acting on the semiconductor integrated circuit 25 may be mitigated by the support region 31.

According to the semiconductor device 11, induction currents due to electromagnetic induction resulting from the electronic connection of the semiconductor IC 13 and capacitor element 15 may be reduced. Furthermore, electromagnetic induction acting on a power supply system of the internal circuit 25*a* from the antenna, via the output of the another internal circuit 25*b* that is the voltage regulator, may be reduced. Therefore, failures of the semiconductor IC 13 that are caused by the generation of induction currents from electromagnetic induction may be suppressed.

Figure 2:
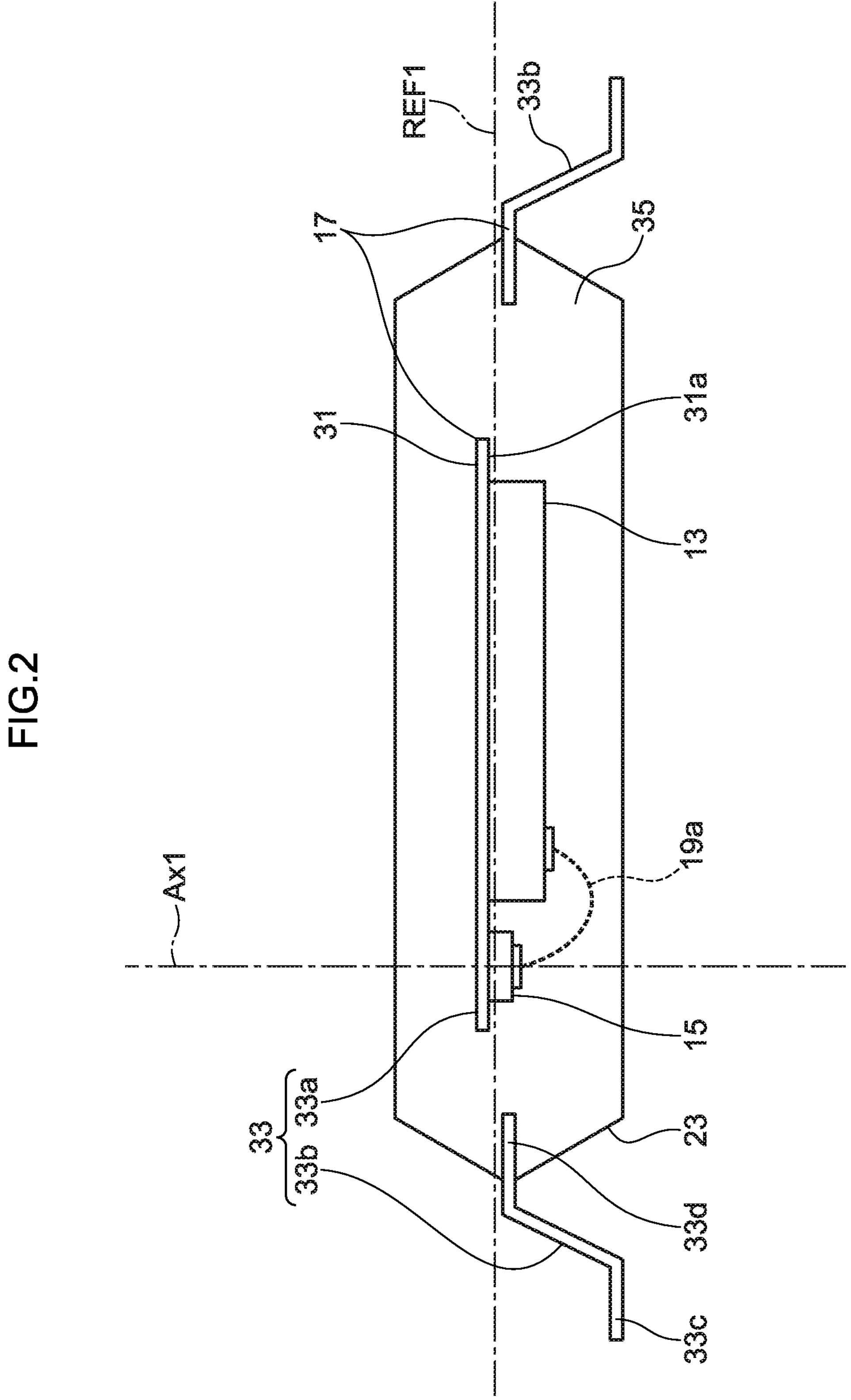
FIG. 2 is a sectional diagram showing the semiconductor device according to the exemplary embodiment of the present disclosure in a section cut along line II-II shown in FIG. 1.

FIG. 2 is a sectional diagram taken along line II-II of the semiconductor device 11 in FIG. 1. Referring to FIG. 2, the capacitor element 15 and the support region 31 are arranged along the direction of an axis Ax1, which extends in a direction orthogonal to the principal surface 31*a* of the support region 31. Although the semiconductor IC 13 and the capacitor element 15 are disposed apart from one another at the principal surface 31*a* of the support region 31, they are preferably located close together in order to reduce the size of the loop antenna. In FIG. 2, the first conductor 19*a* electronically connecting the capacitor element 15 with the semiconductor IC 13 is depicted by a broken line.

The principal surface 31*a* of the support region 31 extends along a reference plane REF1 that is orthogonal to the above-mentioned axis Ax1. The semiconductor IC 13 and the capacitor element 15 are arranged along the reference plane REF1.

Referring to FIG. 2, the first conductor 19*a* is disposed such that, as seen in the direction of axis Ax1 that intersects the reference plane REF1, which is to say the direction orthogonal to the principal surface 31*a* of the support region 31, the whole of the first conductor 19*a* is contained in the principal surface 31*a* of the support region 31. Similarly to the first conductor 19*a*, the second conductor 19*b* (not shown in the drawing) is disposed such that, as seen in the direction orthogonal to the principal surface 31*a* of the support region 31, the whole of the second conductor 19*b* is contained in the principal surface 31*a* of the support region 31. Thus, the loop antenna that is the electronic connection including the first IC terminal 27*a* of the semiconductor IC 13, the first conductor 19*a*, the first terminal 29*a* of the capacitor element 15, the second terminal 29*b* of the capacitor element 15, the second conductor 19*b* and the second IC terminal 27*b* of the semiconductor IC 13 is disposed such that, as seen in the direction orthogonal to the principal surface 31*a* of the support region 31, the whole of the loop antenna is contained in the principal surface 31*a* of the support region 31. In the present exemplary embodiment, the direction intersecting the reference plane REF1 is a perpendicular direction that is orthogonal to the reference plane REF1 and the principal surface 31*a* of the support region 31.

Therefore, because the loop antenna is disposed so as to be contained in the principal surface 31*a* of the support region 31 as seen in the direction orthogonal to the principal surface 31*a* of the support region 31, penetration of magnetic flux in the direction from the support region 31 toward the capacitor element 15, intrusion of electromagnetic noise and the like are impeded by the support region 31.

Next, a lead frame that serves as an example of the support portion 17 in the semiconductor device according to the present exemplary embodiment is described with reference to FIG. 1 and FIG. 2.

As shown in FIG. 2, the support portion 17 includes, for example, a lead frame 33. The lead frame 33 includes a die pad 33*a* that serves as the support region 31 and plural lead terminals 33*b* that serve as connection terminals of the support portion 17. The die pad 33*a* and lead terminals 33*b* are arranged along the reference plane REF1. The die pad 33*a* may be, for example, a flat, plate-shaped metal body. The lead terminals 33*b* are spaced apart from the die pad 33*a* and may also be fabricated of metal. At least some of the plural lead terminals 33*b*—all of the lead terminals 33*b* in the present exemplary embodiment—are inflected in a direction toward the capacitor element 15 from the die pad 33*a*. The meaning of the term "a direction toward the capacitor element 15 from the die pad 33*a*" as used herein is intended to include a direction toward the lower side of the first axis Ax1 in FIG. 6.

At least some of the plural lead terminals 33*b* may be arranged along one side of the die pad 33*a*. Referring to FIG. 1, the plural lead terminals 33*b* are arrayed along each of four sides of the die pad 33*a*.

According to the semiconductor device 11, because the semiconductor IC 13 and capacitor element 15 are mounted at the lead frame 33, the die pad 33*a* may block electromagnetic noise, meaning external magnetic fields.

As shown in FIG. 2, one or more of the plural lead terminals 33*b* may be provided so as to be inflected in the direction toward the capacitor element 15 (and the semiconductor IC 13) from the support portion 17 inside the sealing body and/or outside the sealing body.

The sealing body 23 seals in the semiconductor IC 13, the capacitor element 15, the first conductor 19*a*, the second conductor 19*b* and the die pad 33*a*. In the present exemplary embodiment, the sealing body 23 may include a resin body that is an epoxy resin. The die pad 33*a* is contained in the resin body of the sealing body 23, together with the semiconductor IC 13, the capacitor element 15, the first conductor 19*a* and the second conductor 19*b*, but at least portions of the lead terminals 33*b* protrude from the resin body of the sealing body 23. More specifically, each of the plural lead terminals 33*b* includes a first portion 33*c* that protrudes from the resin body and a second portion 33*d* that extends inside the resin body.

Each of the first conductor 19*a* and the second conductor 19*b* may include, for example, a member with the form of a metal conducting wire. The metal conducting wire is, for example, a bonding wire. The bonding wire may be, for example, a thin metal wire. Because the bonding wire is a thin, metal, conducting wire, the bonding wire has inductance. Thus, the loop antenna includes serial connection of an inductor and a capacitor.

More specifically, the bonding wire of the first conductor 19*a* extends so as to constitute some or all of the electronic connection path between the first IC terminal 27*a* of the semiconductor IC 13 and the first terminal 29*a* of the capacitor element 15. Meanwhile, the bonding wire of the second conductor 19*b* extends so as to constitute some or all of the electronic connection path between the second IC terminal 27*b* of the semiconductor IC 13 and the second terminal 29*b* of the capacitor element 15. As necessary, one or both of the first terminal 29*a* and second terminal 29*b* of the capacitor element 15 may be connected to the lead terminals 33*b*.

As shown in FIG. 1, in addition to the plural IC terminals 27*a* and 27*b* illustrated in the example, the semiconductor IC 13 includes the third IC terminal 27*c* that is depicted as one of the plural IC terminals. The third IC terminal 27*c* is connected to one of the lead terminals 33*b* by, for example, a bonding wire structured by the third conductor 19*c*.

Now, the capacitor element 15 is described with reference to FIG. 3 and FIG. 4.

Figure 3:
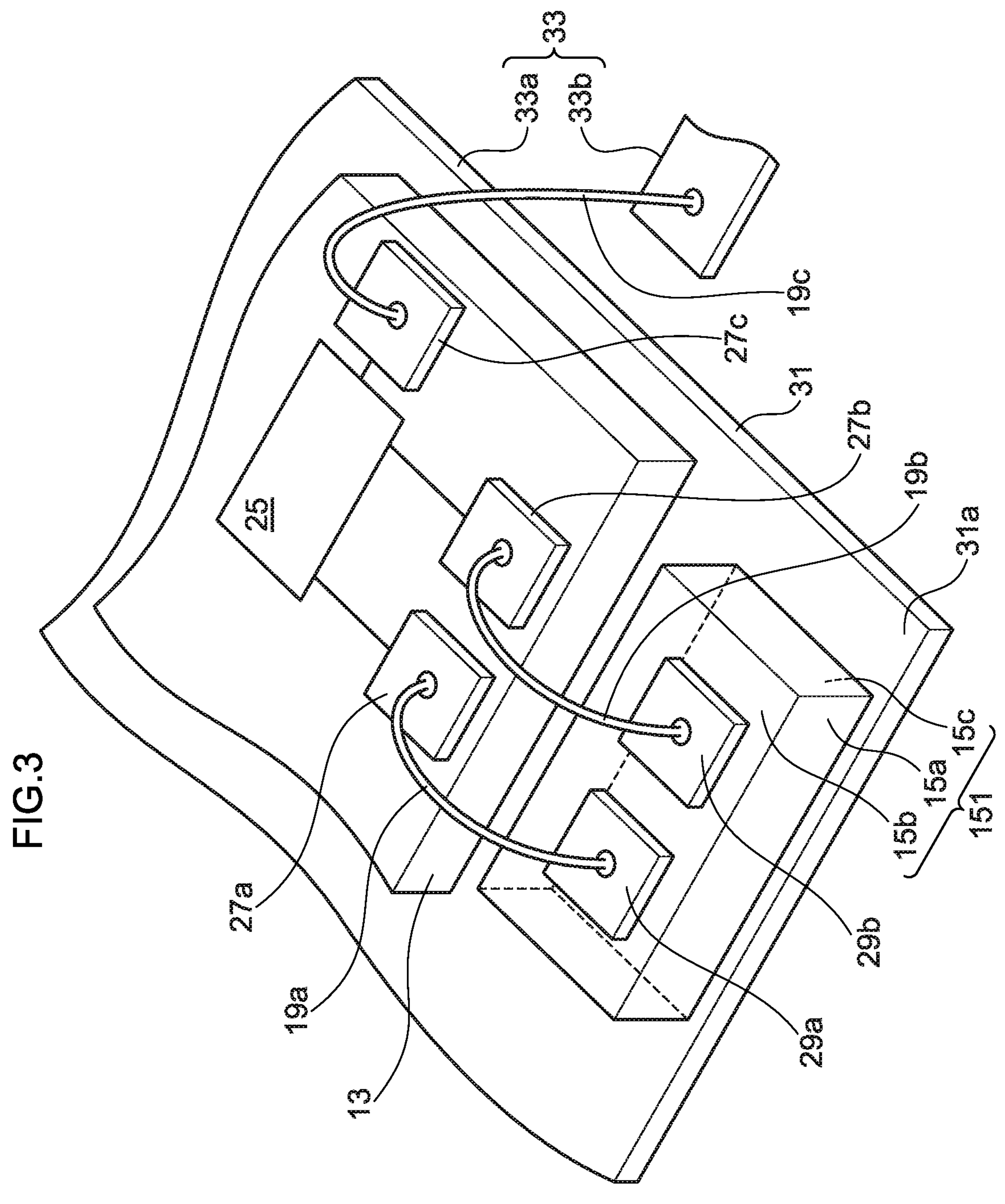
FIG. 3 is a schematic view showing a mode of a capacitor element for the semiconductor device according to the exemplary embodiment of the present disclosure.

Referring to FIG. 3, a capacitor element 151 that serves as a mode of the capacitor element 15 in FIG. 1 and FIG. 2 is illustrated. In addition to the first terminal 29*a* and the second terminal 29*b*, the capacitor element 151 includes a main body 15*a*. The main body 15*a* of the capacitor element 151 has a principal surface 15*b* and a back surface 15*c*, which is at the opposite side of the main body 15*a* from the principal surface 15*b*. In the capacitor element 151, the first terminal 29*a* and second terminal 29*b* may be provided at the same face of the main body 15*a*, for example, the principal surface 15*b*. Similarly to the semiconductor IC 13, the back surface 15*c* of the capacitor element 151 is fixed by adhesive to the support region 31, for example, to the principal surface 31*a* of the die pad 33*a*. The first conductor 19*a* includes a bonding wire that directly connects the first IC terminal 27*a* of the semiconductor IC 13 with the first terminal 29*a* of the capacitor element 151. If possible, the second conductor 19_b_ may include a bonding wire that directly connects the second IC terminal 27_b_ of the semiconductor IC 13 with the second terminal 29_b_ of the capacitor element 151.

Figure 4:
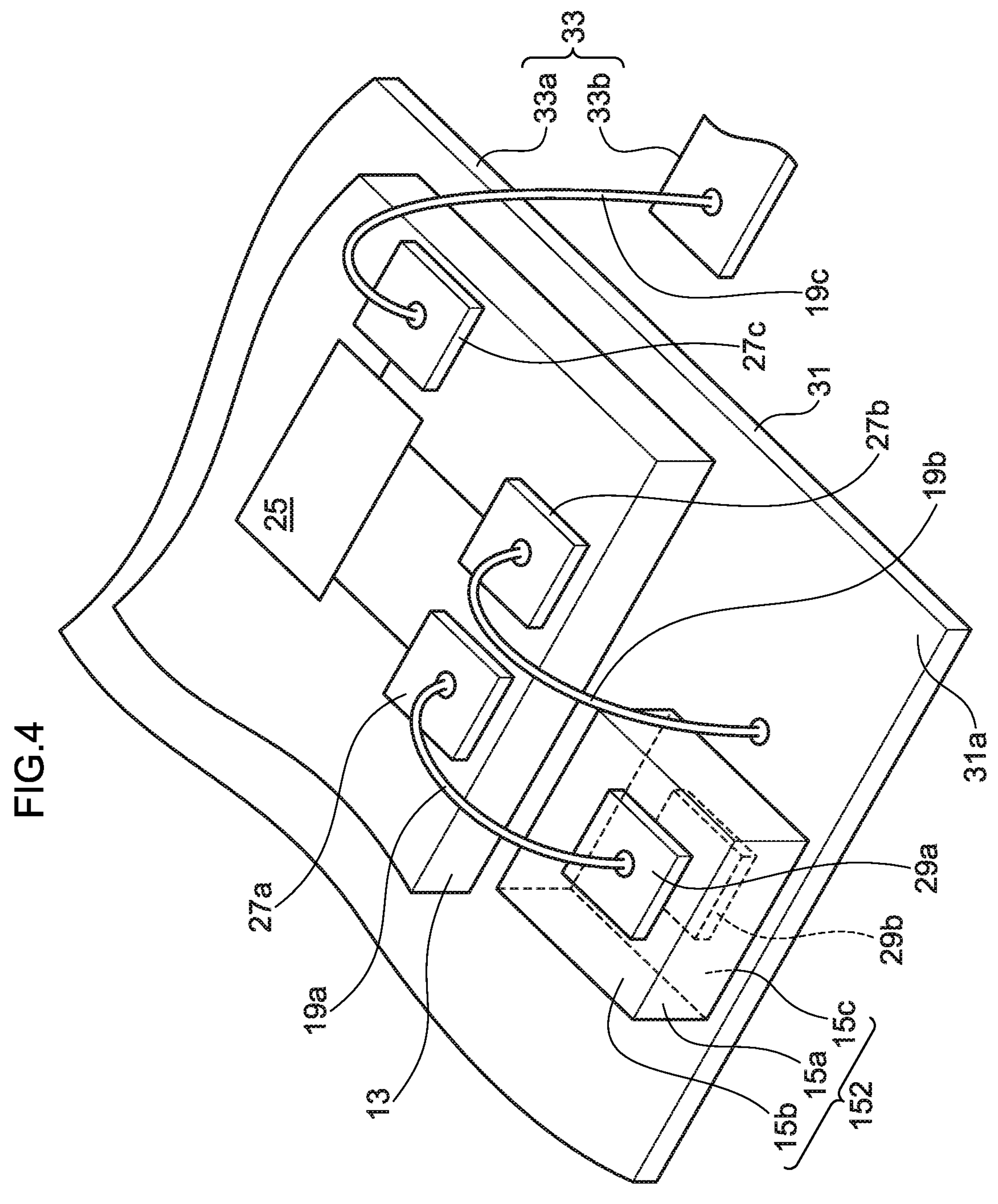
FIG. 4 is a schematic view showing an alternative mode of the capacitor element for the semiconductor device according to the exemplary embodiment of the present disclosure.

Referring to FIG. 4, a capacitor element 152 that serves as an alternative mode of the capacitor element 15 in FIG. 1 and FIG. 2 is illustrated. In addition to the first terminal 29_a_ and the second terminal 29_b_, the capacitor element 152 includes the main body 15_a_. The main body 15_a_ of the capacitor element 152 has the principal surface 15_b_ and the back surface 15_c_ at the opposite side of the main body 15_a_ from the principal surface 15_b_. In the capacitor element 152, the first terminal 29_a_ and second terminal 29_b_ may be provided at, respectively, the principal surface 15_b_ and the back surface 15_c_. The second terminal 29_b_ of the capacitor element 152 is connected by an electronically conductive adhesive to the support region 31, for example, to the principal surface 31_a_ of the die pad 33_a_. The other of the first conductor 19_a_ and the second conductor 19_b_, for example, the second conductor 19_b_, may include a bonding wire that directly connects the second IC terminal 27_b_ of the semiconductor IC 13 to the support region 31, for example, to the principal surface 31_a_ of the die pad 33_a_.

Second Exemplary Embodiment

A semiconductor device according to the present exemplary embodiment is described with reference to FIG. 5, FIG. 6 and FIG. 7. To avoid complexity in the drawings, hatching to indicate a section is not marked in FIG. 6 and FIG. 7. Similarly to the sectional diagram of FIG. 2, the first conductor 19_a_ is depicted by a broken line in FIG. 6 and FIG. 7.

Figure 5:
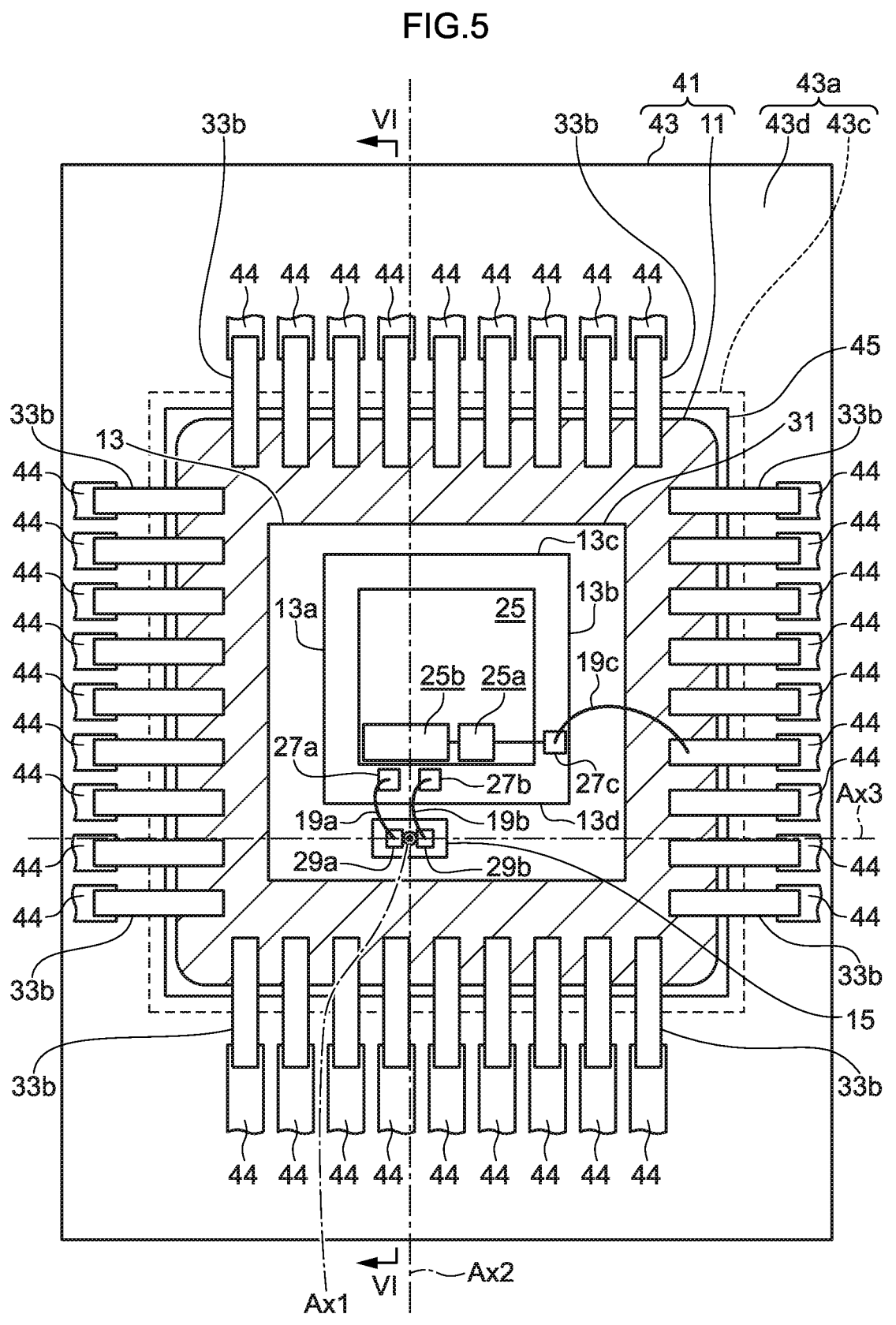

Next, for convenience of description, a second axis Ax2 and a third axis Ax3 as shown in FIG. 5 are introduced. The second axis Ax2 is orthogonal to the first axis Ax1, and the third axis Ax3 is orthogonal to the first axis Ax1 and the second axis Ax2. In the present exemplary embodiment, the second axis Ax2 and the third axis Ax3 are oriented along, respectively, one pair of sides 13_a_ and 13_b_ of the semiconductor IC 13 and another pair of sides 13_c_ and 13_d_ of the semiconductor IC 13.

FIG. 5 is a plan view of a semiconductor module 41 according to the present exemplary embodiment. The semiconductor module 41 is equipped with the semiconductor device 11 according to the first exemplary embodiment and a printed circuit board 43. The semiconductor device 11 is assigned the same reference symbols as the semiconductor device 11 according to the first exemplary embodiment. Accordingly, duplicative descriptions are not given.

Figure 6:
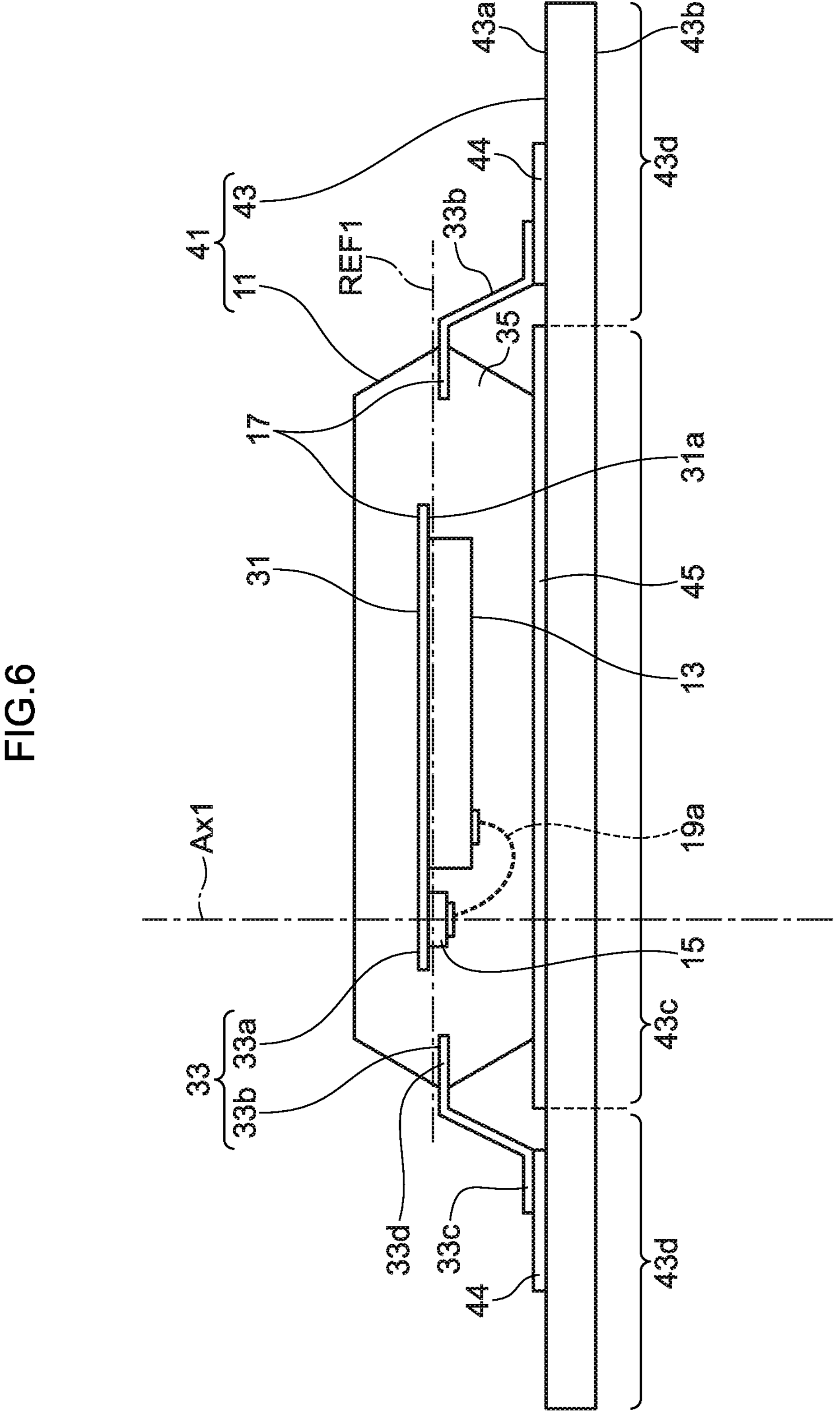
FIG. 6 is a sectional diagram showing a semiconductor module according to the exemplary embodiment of the present disclosure in a section cut along line VI-VI shown in FIG. 5.

FIG. 6 is a sectional diagram showing the semiconductor module 41 according to the present exemplary embodiment. The printed circuit board 43 includes a principal surface 43_a_ and a back surface 43_b_. The principal surface 43_a_ includes a mounting area 43_c_ at which the semiconductor device 11 is mounted and a wiring area 43_d_ surrounding the mounting area 43_c_. In the mounting area 43_c_, the printed circuit board 43, the semiconductor IC 13 and the support region 31 are arranged in this order in the direction along the first axis Ax1, which is orthogonal to the principal surface 31_a_ of the support region 31 and the principal surface 43_a_ of the printed circuit board 43. The printed circuit board 43 includes a conductive layer 44 for interconnection, which is provided in the wiring area 43_d_. The conductive layer 44 is connected to the lead terminals 33_b_ of the semiconductor device 11 mounted on the printed circuit board 43.

In the semiconductor module 41, as illustrated in FIG. 5 and FIG. 6, the printed circuit board 43 may include a conductive layer 45. The capacitor element 15, the first conductor 19_a_ and the second conductor 19_b_ may be provided between the conductive layer 45 of the printed circuit board 43 and the support region 31.

According to this semiconductor module 41, the electronic connection including the first IC terminal 27_a_ of the semiconductor IC 13, the first conductor 19_a_, the first terminal 29_a_ of the capacitor element 15, the second terminal 29_b_ of the capacitor element 15, the second conductor 19_b_, and the second IC terminal 27_b_ of the semiconductor IC 13 is electrically closed off by the semiconductor integrated circuit 25 of the semiconductor IC 13, forming a loop antenna. The principal surface 31_a_ of the support region 31 supports the capacitor element 15 and the semiconductor IC 13, and the first conductor 19_a_ and second conductor 19_b_ connect from one to the other of the semiconductor IC 13 and the capacitor element 15. Therefore, the support region 31 blocks electromagnetic noise, meaning external magnetic flux in the direction from the support region 31 toward the capacitor element 15. Thus, external magnetic flux amounts passing through the loop antenna and electromagnetic noise may be reduced.

The support region 31, the semiconductor IC 13 and the printed circuit board 43 are arranged in this order in the direction of the first axis Ax1 that is orthogonal to the principal surface 31_a_ of the support region 31 (and the principal surface 43_a_ of the printed circuit board 43). According to this arrangement, the first IC terminal 27_a_ and second IC terminal 27_b_ of the semiconductor IC 13, the first terminal 29_a_ and second terminal 29_b_ of the capacitor element 15, the first conductor 19_a_ and the second conductor 19_b_, which constitute the loop antenna, are located between the conductive layer 45 and the support region 31. When the loop antenna is placed between the conductive layer 45 and the support region 31, external magnetic flux amounts passing through the loop antenna and external electromagnetic noise may be reduced.

When the first conductor 19_a_ and second conductor 19_b_, which are portions of the loop antenna, are disposed at the inner side relative to the outer edge of the principal surface 31_a_ of the support region 31 in plan view, effects of electromagnetic induction acting on the semiconductor integrated circuit 25 may be mitigated by the support region 31.

Furthermore, when the first conductor 19_a_ and second conductor 19_b_ that are portions of the loop antenna are disposed at the inner side relative to the outer edge of the principal surface 31_a_ of the support region 31 and an outer edge of the conductive layer 45 in plan view, effects of electromagnetic induction acting on the semiconductor integrated circuit 25 may be mitigated by the support region 31 and the conductive layer 45.

Therefore, according to the positional relationships of the first conductor 19_a_ and second conductor 19_b_ and the support region 31 described above, the semiconductor module 41 may reduce induction currents due to electromagnetic induction resulting from the electronic connection of the semiconductor IC 13 with the capacitor element 15. In addition, according to the positional relationships of the first conductor 19_a_ and second conductor 19_b_ and the conductive layer 45, the semiconductor module 41 may reduce induction currents due to electromagnetic induction resulting from the electronic connection of the semiconductor IC 13 with the capacitor element 15. Thus, failures of the semiconductor IC 13 that are caused by the generation of induction currents may be suppressed.

When the semiconductor device 11 includes the lead frame 33 as the support portion 17, at least some of the plural lead terminals 33*b* are inflected in the direction toward the capacitor element 15 from the die pad 33*a*, as illustrated in FIG. 6. The meaning of the term "the direction toward the capacitor element 15 from the die pad 33*a*" as used herein is intended to include the direction toward the printed circuit board 43 along the first axis Ax1 in FIG. 6. When the semiconductor device 11 is mounted at the printed circuit board 43, the inflection direction being the direction from the die pad 33 toward the capacitor element 15 and the semiconductor IC 13 enables the arrangement, in this order, of the die pad 33*a* that is an example of the support region 31, the first conductor 19*a* and second conductor 19*b*, and also the capacitor element 15 and the conductive layer 45 of the printed circuit board 43.

Figure 7:
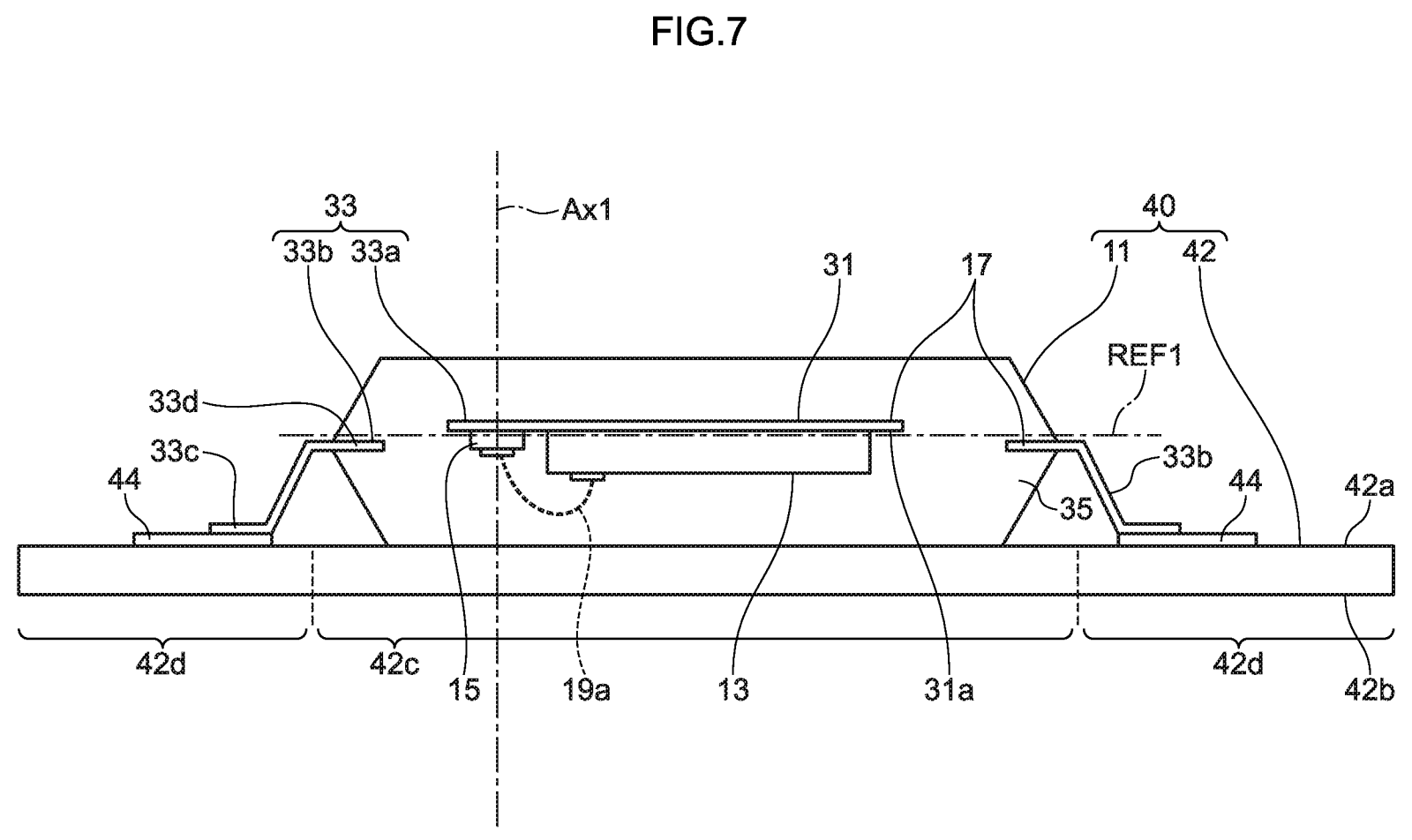

FIG. 7 is a sectional diagram showing a semiconductor module 40 according to the present exemplary embodiment. The section of the semiconductor module 40 shown in FIG. 7 is cut such that the section of the semiconductor device 11 in FIG. 7 matches the section of the semiconductor device 11 in FIG. 6. The semiconductor module 40 is equipped with the semiconductor device 11 according to the first exemplary embodiment and a printed circuit board 42. The semiconductor device 11 is assigned the same reference symbols as the semiconductor device 11 according to the first exemplary embodiment. Accordingly, duplicative descriptions are not given.

The printed circuit board 42 has a principal surface 42*a* and a back surface 42*b*. The principal surface 42*a* includes a mounting area 42*c* at which the semiconductor device 11 is mounted and a wiring area 42*d* surrounding the mounting area 42*c*. In the mounting area 42*c*, the printed circuit board 42, the semiconductor IC 13 and the support region 31 are arranged in this order in the direction along the first axis Ax1, which is orthogonal to the principal surface 31*a* of the support region 31 and the principal surface 42*a* of the printed circuit board 42. The printed circuit board 42 includes the conductive layer 44 for interconnection, which is provided in the wiring area 42*d*. The conductive layer 44 is connected to the lead terminals 33*b* of the semiconductor device 11 mounted on the printed circuit board 42. The printed circuit board 42 differs from the printed circuit board 43 shown in FIG. 5 and FIG. 6 in that the printed circuit board 42 is not equipped with the conductive layer 45.

When the semiconductor device 11 includes the lead frame 33 as the support portion 17, at least some of the plural lead terminals 33*b* are inflected in the direction toward the capacitor element 15 from the die pad 33*a*, as illustrated in FIG. 7. The meaning of the term "the direction toward the capacitor element 15 from the die pad 33*a*" as used herein is intended to include the direction toward the printed circuit board 42 along the first axis Ax1 in FIG. 7. When the semiconductor device 11 is mounted at the printed circuit board 42, the inflection direction being the direction from the die pad 33 toward the capacitor element 15 and the semiconductor IC 13 enables the arrangement, in this order, of the die pad 33*a* that is an example of the support region 31, the first conductor 19*a* and second conductor 19*b*, and also the capacitor element 15 and the printed circuit board 42.

Some examples of the printed circuit board 43 are illustrated with reference to FIG. 8 to FIG. 11. The printed circuit board 43 shown in FIG. 9 to FIG. 11 differs from the printed circuit board 42 shown in FIG. 8 in being equipped with the conductive layer 45. The first axis Ax1, second axis Ax2 and third axis Ax3 are plotted in FIG. 8 to FIG. 11.

Figure 8:
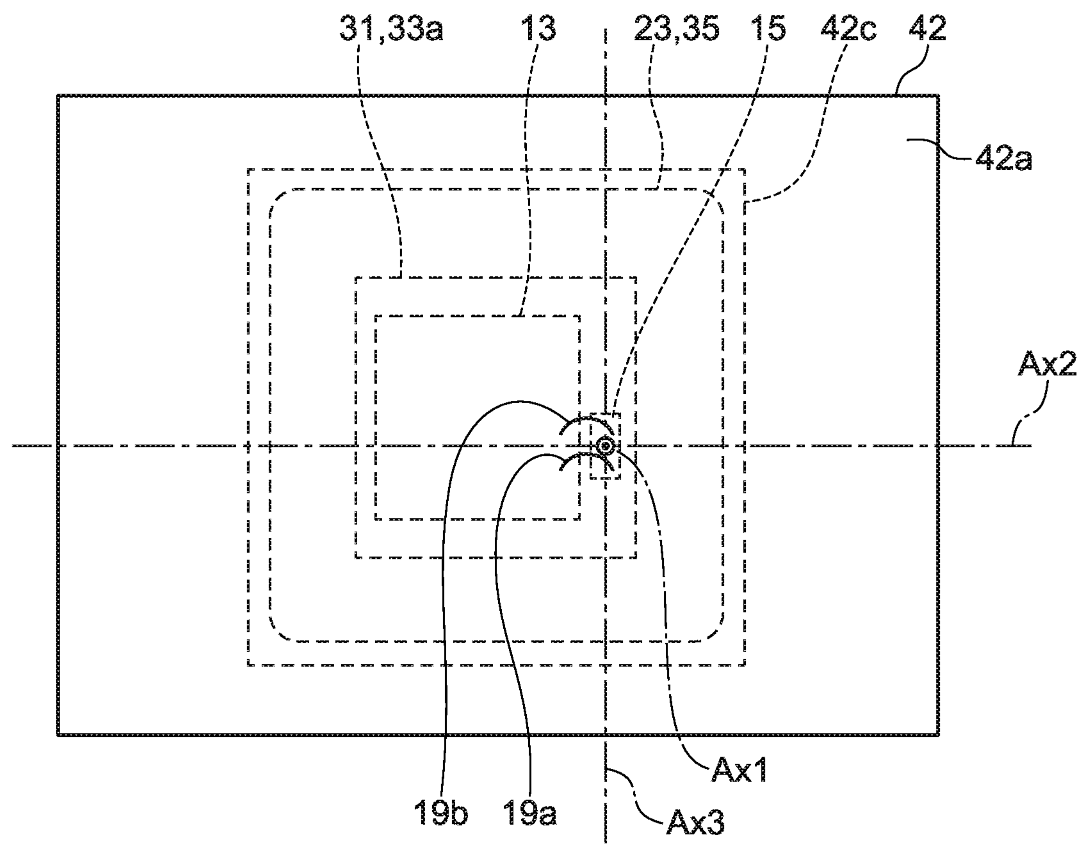
FIG. 8 is a plan view showing a principal surface of a printed circuit board of the semiconductor module according to the exemplary embodiment of the present disclosure.

FIG. 8 is a plan view showing the printed circuit board 42 shown in FIG. 7. Referring to FIG. 8, the printed circuit board 42 according to one mode is illustrated. The outer shape of the principal surface 42*a* of the printed circuit board 42, the first conductor 19*a* and the second conductor 19*b* are depicted by solid lines. The semiconductor IC 13, the capacitor element 15, the sealing body 23, the support region 31 and the mounting area 42*c* are depicted by broken lines.

The sealing body 23 seals in the capacitor element 15, the semiconductor IC 13, the first conductor 19*a*, the second conductor 19*b* and the support region 31 (or die pad 33*a*).

According to this mode, the semiconductor IC 13 and the capacitor element 15 are supported by the principal surface 31*a* of the support region 31 and are disposed on the principal surface 31*a*. The first conductor 19*a* and second conductor 19*b* both connect from one to the other of the semiconductor IC 13 and capacitor element 15 so as to electronically connect the semiconductor IC 13 and the capacitor element 15 with one another. According to these connections, the electronic connection including the first IC terminal 27*a* of the semiconductor IC 13, the first conductor 19*a*, the first terminal 29*a* of the capacitor element 15, the second terminal 29*b* of the capacitor element 15, the second conductor 19*b* and the second IC terminal 27*b* of the semiconductor IC 13 is electronically closed off by the semiconductor integrated circuit 25 of the semiconductor IC 13, forming the loop antenna. The support region 31 blocks electromagnetic noise, meaning external magnetic flux in the direction from the support region 31 toward the capacitor element 15. As a result, for example, external magnetic flux amounts passing through the loop antenna may be reduced.

When the first conductor 19*a* and second conductor 19*b*, which are portions of the loop antenna, are disposed at the inner side relative to the outer edge of the principal surface 31*a* of the support region 31, effects of electromagnetic induction acting on the semiconductor integrated circuit 25 may be mitigated by the support region 31.

Furthermore, according to this mode, induction currents due to electromagnetic induction resulting from the electronic connection of the semiconductor IC 13 and capacitor element 15 may be reduced. Thus, failures of the semiconductor IC 13 that are caused by the generation of induction currents may be suppressed.

Figure 9:
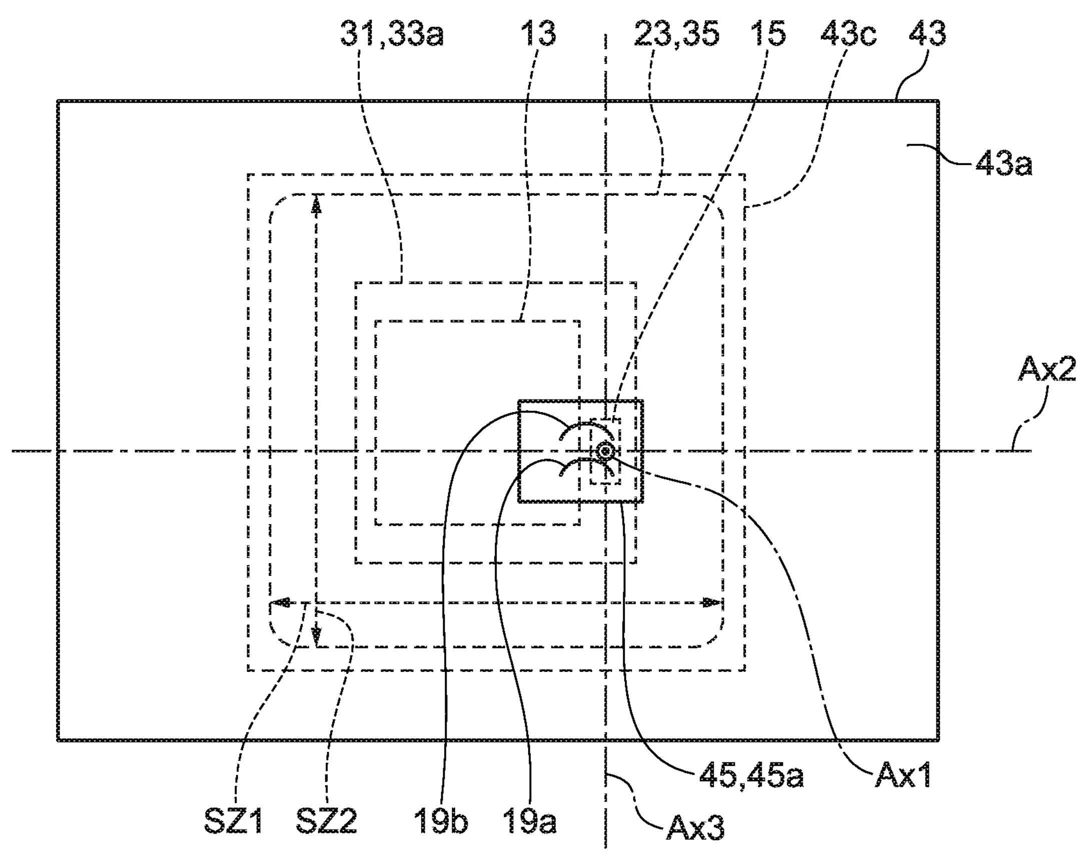
FIG. 9 is a plan view showing the principal surface of the printed circuit board of the semiconductor module according to the exemplary embodiment of the present disclosure and a conductive layer provided at the principal surface.
Figure 10:
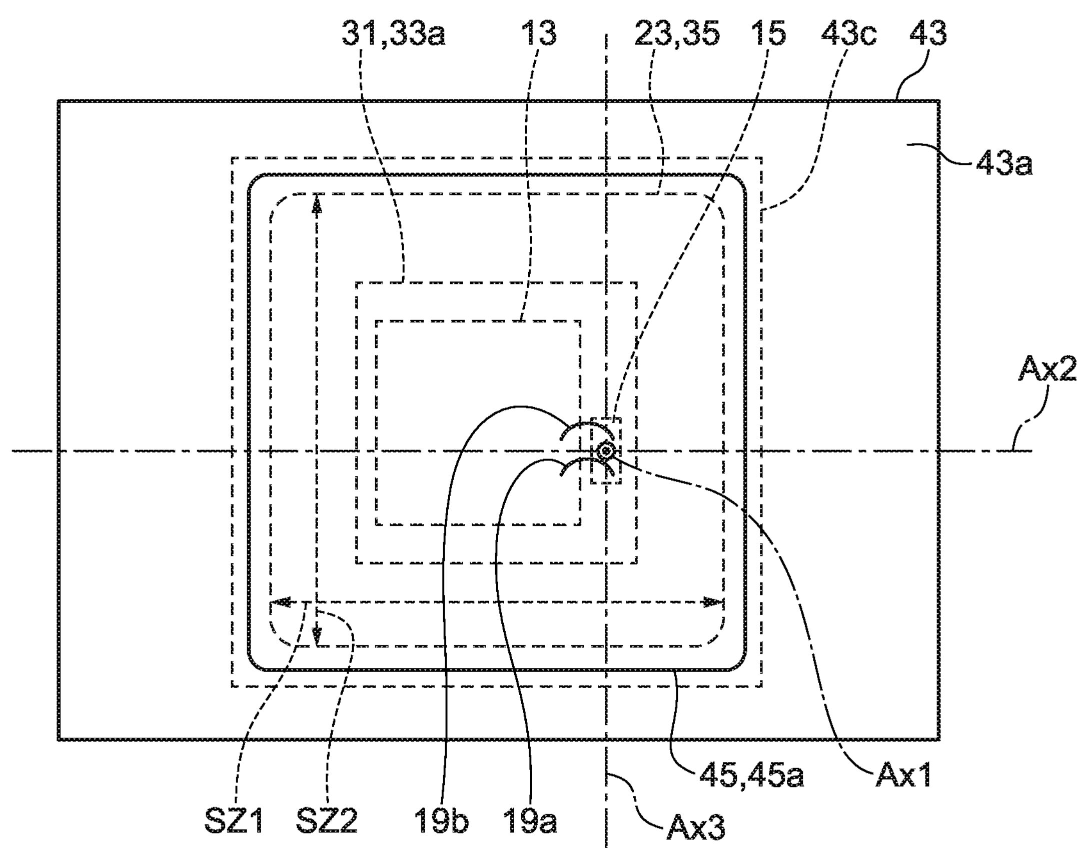
FIG. 10 is a plan view showing the principal surface of the printed circuit board of the semiconductor module according to the exemplary embodiment of the present disclosure and a conductive layer provided at the principal surface.
Figure 11:
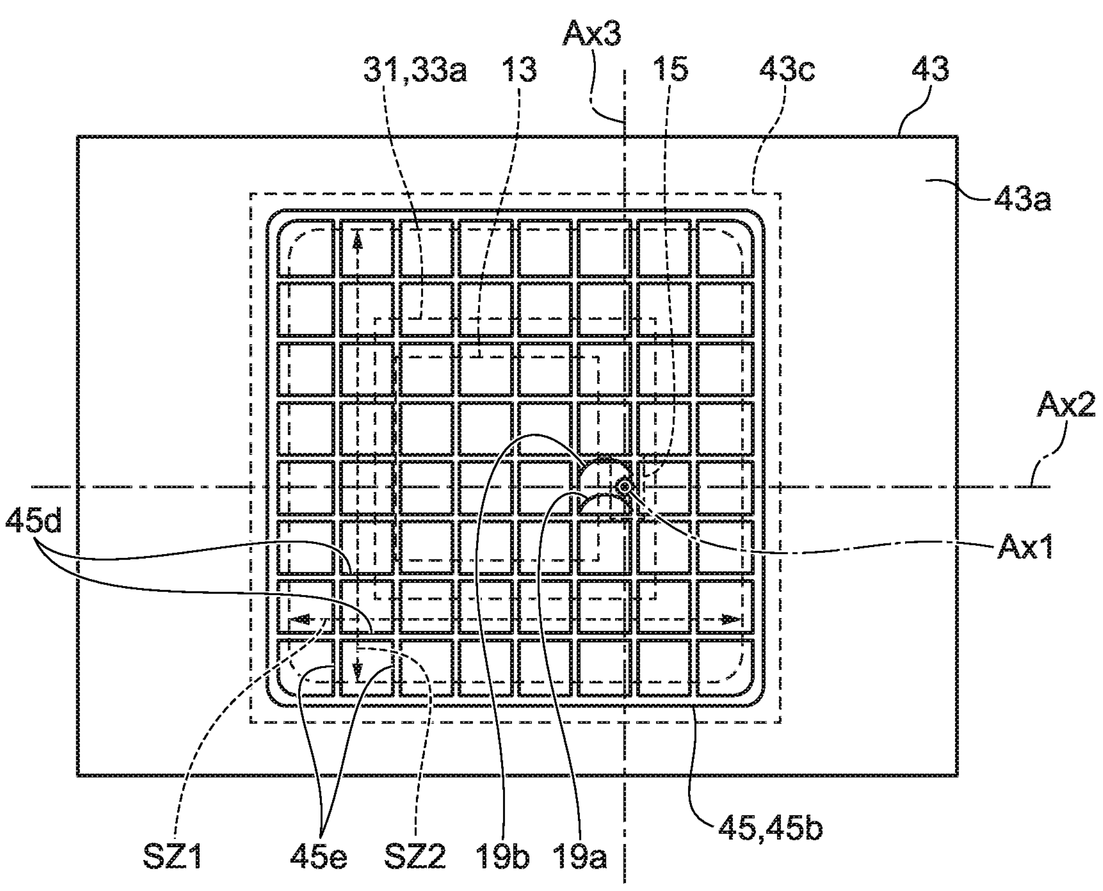
FIG. 11 is a plan view showing the principal surface of the printed circuit board of the semiconductor module according to the exemplary embodiment of the present disclosure and a conductive layer provided at the principal surface.

Referring to FIG. 9, FIG. 10 and FIG. 11, the principal surface 43*a* of the printed circuit board 43 is illustrated. The outer shapes of the printed circuit board 43 and the conductive layer 45 along with the first conductor 19*a* and the second conductor 19*b* are depicted by solid lines. The outer shapes of the semiconductor IC 13, the capacitor element 15, the sealing body 23 and the support region 31 are depicted by broken lines.

The sealing body 23 seals in the capacitor element 15, the semiconductor IC 13, the first conductor 19*a*, the second conductor 19*b* and the support region 31 (or die pad 33*a*). The sealing body 23 has a first size SZ1 in the direction of the second axis Ax2 and a second size SZ2 in the direction of the third axis Ax3.

Variant Example 1

Referring to FIG. 9, the outer edge of the conductive layer 45 of the printed circuit board 43 has a smaller dimension than the first size SZ1 in the direction of the second axis Ax2 and has a smaller dimension than the second size SZ2 in the direction of the third axis Ax3. The capacitor element 15, the first conductor 19*a* and the second conductor 19*b* are disposed between the conductive layer 45 and the support region 31. More specifically, in a plan view seen in the direction of the first axis Ax1, the outer edge of the conductive layer 45 encompasses the outer edge of the capacitor element 15 and encompasses the loop antenna that includes the first conductor 19*a* and second conductor 19*b*, and the outer edge of the conductive layer 45 overlaps with portions of the semiconductor IC 13.

FIG. 10 is a plan view showing the printed circuit board 43 that is shown in FIG. 5 and FIG. 6. Referring to FIG. 10, the outer edge of the conductive layer 45 of the printed circuit board 43 has a dimension that is at least the first size SZ1 in the direction of the second axis Ax2 and has a dimension that is at least the second size SZ2 in the direction of the third axis Ax3. According to the semiconductor module 41, in a plan view seen in the direction of the first axis Ax1, the sealing body 23 is at the inner side of the outer edge of a simply connected conductor film 45*a*. The capacitor element 15, the semiconductor IC 13, the first conductor 19*a* and the second conductor 19*b* are disposed between the simply connected conductor film 45*a* and the support region 31.

As shown in FIG. 9 and FIG. 10, in the printed circuit board 43, the conductive layer 45 may be the simply connected conductor film 45*a*, which is provided in the mounting area 43*c*. The first conductor 19*a* and second conductor 19*b* are provided between the conductor film 45*a* of the printed circuit board 43 and the support region 31. According to this semiconductor module 41, the simply connected conductor film 45*a* serves as the conductive layer 45. The simply connected conductor film 45*a* may be provided to be a portion of the size of the support region 31 or to be larger than the size of the support region 31.

The simply connected conductor film 45*a* may block magnetic flux in a direction from the printed circuit board 43 toward the capacitor element 15 (and/or the semiconductor IC 13), and electromagnetic noise and the like.

According to the conductor film 45*a* of the printed circuit board 43 and the support region 31, component costs may be restrained, and electromagnetic noise resistance may be improved without physical arrangements on the printed circuit board 43 being restricted.

Variant Example 2

Referring to FIG. 11, the conductive layer 45 may have one or a plural number of openings. For example, a conductor film 45*b* that is an example of the conductive layer 45 may include, in the principal surface 43*a* of the printed circuit board 43, plural first conductive stripes 45*d* and plural second conductive stripes 45*e*. The first conductive stripes 45*d* extend in the direction of the second axis Ax2 and the second conductive stripes 45*e* extend in the direction of the third axis Ax3. At least some of the first conductive stripes 45*d* intersect with at least some of the second conductive stripes 45*e*. The first conductor 19*a* and second conductor 19*b* are provided between the conductive layer 45 of the printed circuit board 43 and the support region 31. The shape of the conductive layer 45 shown in FIG. 11 compares with a grid shape serving as the conductor layer 45*b*. The opening size of one side of the grid may be, for example, between 1 mm and 5 mm.

According to this semiconductor module 41, the conductive layer 45 is the grid-shaped conductor film 45*b*. The grid-shaped conductor film 45*b* may be provided to be a portion of the size of the support region 31 or to be larger than the size of the support region 31.

The grid-shaped conductor film 45*b* may block magnetic flux in a direction from the printed circuit board 43 toward the capacitor element 15 (and/or the semiconductor IC 13), and electromagnetic noise and the like.

According to the conductor film 45*b* of the printed circuit board 43 and the semiconductor IC 13, component costs may be restrained, and electromagnetic noise resistance may be improved without physical arrangements on the printed circuit board 43 being restricted.

The outer edge of the grid-shaped conductor film 45*b* has a dimension of the first size SZ1 in the direction of the second axis Ax2 and has a dimension of the second size SZ2 in the direction of the third axis Ax3. According to this semiconductor module 41, in a plan view seen in the direction of the first axis Ax1, a sealing body 35 is at the inner side of the outer edge of the grid-shaped conductor film 45*b*. The capacitor element 15, the semiconductor IC 13, the first conductor 19*a* and the second conductor 19*b* are disposed between the grid-shaped conductor film 45*b* and the support region 31.

When required, the outer edge of the grid-shaped conductor film 45*b* may, similarly to the simply connected conductor film 45*a* shown in FIG. 9, have a smaller dimension than the first size SZ1 in the direction of the second axis Ax2 and have a smaller dimension than the second size SZ2 in the direction of the third axis Ax3. The capacitor element 15, the first conductor 19*a* and the second conductor 19*b* are disposed between the conductor film 45*b* and the support region 31. More specifically, in a plan view seen in the direction of the first axis Ax1, the outer edge of the conductor film 45*b* (the conductive layer 45) encompasses the outer edge of the capacitor element 15 and encompasses the loop antenna that includes the first conductor 19*a* and second conductor 19*b*, and the outer edge of the conductor film 45*b* overlaps with portions of the semiconductor IC 13.

What is claimed is:

1. A semiconductor device comprising:

a semiconductor IC including a semiconductor integrated circuit, a first IC terminal and a second IC terminal;

a capacitor element including a first terminal and a second terminal;

a support portion including a support region with a principal surface that supports the capacitor element and the semiconductor IC;

a first conductor and a second conductor that extend so as to connect the first terminal and second terminal of the capacitor element with, respectively, the first IC terminal and second IC terminal of the semiconductor IC; and a sealing body that encloses the capacitor element, the semiconductor IC, the first conductor, the second conductor and the support region, wherein, in a plan view, the first IC terminal and second IC terminal of the semiconductor IC, the first terminal and second terminal of the capacitor element, the first conductor and the second conductor are disposed at the inner side relative to an outer edge of the principal surface of the support region, the semiconductor integrated circuit includes an internal circuit and a voltage regulator that provides power to the internal circuit, the voltage regulator has an output that is connected to the first IC terminal, the electrical connection, including the first IC terminal and second IC terminal of the semiconductor IC, the first terminal and second terminal of the capacitor element, the first conductor and the second conductor are electrically closed by the semiconductor integrated circuit, wherein, the support region is a metal body, and, as seen in a direction orthogonal to the principal surface of the support region, an entirety of the electrical connection closed by the semiconductor integrated circuit is contained in the principal surface of the support region.

2. The semiconductor device according to claim 1, wherein the support portion includes a lead frame, the lead frame includes a die pad, the die pad being the support region, and a plurality of lead terminals spaced apart from the die pad, and the sealing body includes resin that seals in the capacitor element, the semiconductor IC, the first conductor, the second conductor and the die pad.

3. The semiconductor device according to claim 2, wherein at least one of the plurality of lead terminals is inflected in a first direction toward the capacitor element from the die pad.

4. The semiconductor device according to claim 2, wherein all of the plurality of lead terminals are inflected in a first direction toward the capacitor element from the die pad.

5. The semiconductor device according to claim 1, wherein the first conductor includes a bonding wire that directly connects the first IC terminal of the semiconductor IC with the first terminal of the capacitor element.

6. The semiconductor device according to claim 1, wherein the second conductor includes a bonding wire that directly connects the second IC terminal of the semiconductor IC with the principal surface of the support region, and the second terminal of the capacitor element is connected with the principal surface of the support region by a conductive adhesive.

7. The semiconductor device according to claim 1, wherein the second conductor includes a bonding wire that directly connects the second IC terminal of the semiconductor IC with the second terminal of the capacitor element.

8. A semiconductor module comprising:

the semiconductor device according to claim 1; and a printed circuit board with a principal surface that includes a mounting area on which the semiconductor device is mounted, wherein the first IC terminal and second IC terminal of the semiconductor IC, the first terminal and second terminal of the capacitor element, the first conductor and the second conductor are provided between the printed circuit board and the support region.

9. A semiconductor module comprising:

the semiconductor device according to claim 1; and a printed circuit board with a principal surface that includes a mounting area on which the semiconductor device is mounted, wherein:

the printed circuit board, the semiconductor IC and the support region are arranged in this order along a first axis direction that is orthogonal to the principal surface of the printed circuit board;

the printed circuit board includes a conductive layer; and the first IC terminal and second IC terminal of the semiconductor IC, the first terminal and second terminal of the capacitor element, the first conductor and the second conductor are provided between the conductive layer of the printed circuit board and the support region.

10. The semiconductor module according to claim 9, wherein the conductive layer includes a plurality of first conductive stripes extending in a first direction of the principal surface of the printed circuit board and a plurality of second conductive stripes extending in a second direction of the principal surface of the printed circuit board, the second direction intersecting with the first direction, and at least some of the first conductive stripes intersect with at least some of the second conductive stripes.

11. The semiconductor module according to claim 9, wherein the conductive layer is a simply connected conductive film provided at the mounting area.

12. The semiconductor module according to claim 11, wherein, in a plan view seen in the first axis direction, an outer edge of the conductive layer encompasses an outer edge of the capacitor element and encompasses the first conductor and the second conductor, and the outer edge of the conductive layer overlaps with a portion of the semiconductor IC.

13. The semiconductor device of claim 1, wherein the electrical connection closed by the semiconductor integrated circuit forms a loop-shaped antenna.

14. The semiconductor device according to claim 1, wherein the support region blocks magnetic flux in a direction from the support region toward the capacitor element.

15. The semiconductor device according to claim 1, wherein the semiconductor IC and the capacitor element are disposed in proximity to each other on the principal surface so as to reduce a size of the electrical connection closed by the semiconductor integrated circuit.

* * * * *